(12) United States Patent
Kang et al.

(10) Patent No.: US 9,779,198 B2
(45) Date of Patent: Oct. 3, 2017

(54) INDIVIDUALLY COLORING SEPARATED CELL BLOCKS IN LAYOUT OF INTEGRATED CIRCUITS

(71) Applicant: Samsung Electronics Co., Ltd., Suwon-Si, Gyeonggi-do (KR)

(72) Inventors: Daekwon Kang, Yongin-si (KR); Donggyun Kim, Seoul (KR); Jaeseok Yang, Hwaseong-si (KR); Jiyoung Jung, Hwaseong-si (KR); Chunghee Kim, Hwaseong-si (KR); Ha-Young Kim, Seoul (KR); Sungkeun Park, Goyang-si (KR); Younggook Park, Seongnam-si (KR); Myungsoo Jang, Seoul (KR); Jintae Kim, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/832,307

(22) Filed: Aug. 21, 2015

(65) Prior Publication Data

US 2016/0267210 A1   Sep. 15, 2016

(30) Foreign Application Priority Data

Mar. 13, 2015   (KR) .................. 10-2015-0035095

(51) Int. Cl.
*G06F 17/50* (2006.01)
*G03F 1/70* (2012.01)

(52) U.S. Cl.
CPC ...... *G06F 17/5072* (2013.01); *G06F 17/5081* (2013.01); *G03F 1/70* (2013.01); *G06F 17/5068* (2013.01)

(58) Field of Classification Search
CPC ............. G06F 17/5072; G06F 17/5068; G06F 17/5081; G03F 1/70
See application file for complete search history.

(56) References Cited

U.S. PATENT DOCUMENTS

| | | | |
|---|---|---|---|
| 5,311,336 A | 5/1994 | Kurita et al. | |
| 5,852,562 A | 12/1998 | Shinomiya et al. | |
| 6,282,693 B1 * | 8/2001 | Naylor | G06F 17/5072 716/114 |
| 6,516,457 B1 * | 2/2003 | Kondou | G06F 17/5068 257/202 |
| 6,567,967 B2 * | 5/2003 | Greidinger | G06F 17/5077 716/104 |
| 7,137,092 B2 * | 11/2006 | Maeda | G06F 17/5068 257/E27.107 |
| 7,493,589 B2 * | 2/2009 | Socha | G03F 1/144 430/5 |

(Continued)

FOREIGN PATENT DOCUMENTS

KR   1020020058911 A   7/2002

*Primary Examiner* — Naum B Levin
(74) *Attorney, Agent, or Firm* — Ward and Smith, P.A.

(57) ABSTRACT

A method can include separating a design area of a substrate for a semiconductor integrated circuit (IC) into cell blocks, where a distance between adjacent ones of the cell blocks can be greater than or equal to a minimum distance defined by a design rule for the semiconductor integrated circuit to provide separated cell blocks, designing a layout for the semiconductor IC in the separated cell blocks, and individually coloring the layout of each of the separated cell blocks.

20 Claims, 11 Drawing Sheets

(56) References Cited

U.S. PATENT DOCUMENTS

| | | | | |
|---|---|---|---|---|
| 7,673,278 B2* | 3/2010 | Rathsack | ............... | H01L 22/20 716/56 |
| 7,732,792 B2* | 6/2010 | Matsuoka | ........... | G03F 7/70616 250/306 |
| 7,984,410 B2* | 7/2011 | Chen | .................. | G06F 17/5072 716/118 |
| 8,051,390 B2* | 11/2011 | Frederick | ............ | G06F 17/5068 430/30 |
| 8,069,423 B2* | 11/2011 | Ghan | ................. | G03F 7/70466 716/55 |
| 8,117,381 B2 | 2/2012 | Gonzalez et al. | | |
| 8,341,563 B1* | 12/2012 | Kretchmer | ......... | G06F 17/5072 716/100 |
| 8,495,548 B2* | 7/2013 | Agarwal | ............. | G06F 17/5072 716/110 |
| 8,572,521 B2* | 10/2013 | Chen | ....................... | G03F 1/144 716/52 |
| 8,584,052 B2* | 11/2013 | Chen | ......................... | G03F 1/70 430/30 |
| 8,601,407 B2* | 12/2013 | Wang | ................... | G03F 7/2059 430/30 |
| 8,601,408 B2* | 12/2013 | Chen | .................. | G06F 17/5077 716/126 |
| 8,631,379 B2* | 1/2014 | Chen | .................. | G06F 17/5081 716/113 |
| 8,645,893 B1* | 2/2014 | Yeung | ................ | G06F 17/5068 716/119 |
| 8,762,901 B2 | 6/2014 | Lee et al. | | |
| 8,893,061 B2* | 11/2014 | Rieger | ................ | G06F 17/5068 716/51 |
| 9,024,657 B2* | 5/2015 | Andreev | ........ | H03K 19/018585 326/38 |
| 9,219,175 B2* | 12/2015 | Fukumizu | ........... | H01L 31/0232 |
| 9,262,570 B2* | 2/2016 | Hsu | ...................... | G06F 17/5072 |
| 9,298,084 B2* | 3/2016 | Luo | ............................ | G03F 1/70 |
| 2002/0087939 A1* | 7/2002 | Greidinger | .......... | G06F 17/5072 716/122 |
| 2006/0289750 A1 | 12/2006 | Yamaguchi | | |
| 2007/0266365 A1 | 11/2007 | Kawamoto | | |
| 2009/0125866 A1* | 5/2009 | Wang | .................. | G03F 7/70466 716/50 |
| 2009/0297019 A1 | 12/2009 | Zafar et al. | | |
| 2011/0197168 A1* | 8/2011 | Chen | .................. | G06F 17/5081 716/50 |
| 2012/0072875 A1* | 3/2012 | Ghosh | ................ | G06F 17/5081 716/52 |
| 2012/0286331 A1 | 11/2012 | Aton et al. | | |
| 2013/0159945 A1 | 6/2013 | Kahng et al. | | |
| 2014/0147949 A1 | 5/2014 | Hong et al. | | |
| 2014/0237436 A1 | 8/2014 | Li et al. | | |
| 2015/0095865 A1* | 4/2015 | Bhattacharya | ...... | G03F 7/70466 716/112 |
| 2015/0143309 A1* | 5/2015 | De Dood | ............ | G06F 17/5068 716/107 |
| 2016/0098509 A1* | 4/2016 | Seo | ..................... | G06F 17/5072 716/55 |
| 2016/0147929 A1* | 5/2016 | Hoover | ............... | G06F 17/5081 716/55 |

* cited by examiner

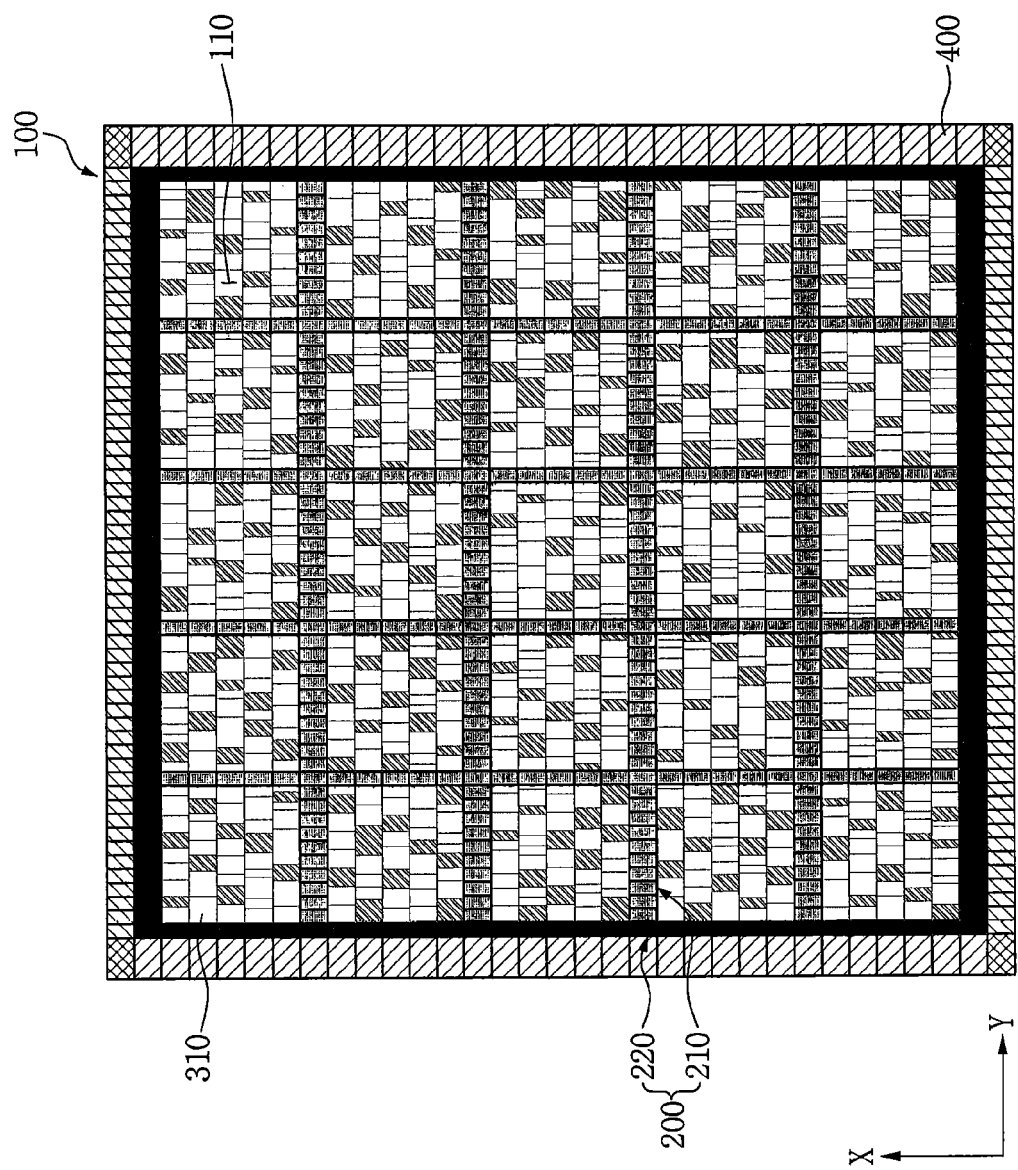

INDIVIDUALLY COLORING SEPARATED CELL BLOCKS IN LAYOUT OF INTEGRATED CIRCUITS

CROSS-REFERENCE TO RELATED APPLICATION

This application claims priority under 35 U.S.C. §119 to Korean Patent Application No. 10-2015-0035095 filed on Mar. 13, 2015, the disclosure of which is hereby incorporated by reference in its entirety.

FIELD

Embodiments of the inventive concept relate the field of semiconductors, and more particularly to the layout of semiconductor integrated circuits.

BACKGROUND

Semiconductor integrated circuits (ICs) can be designed using a layout that shows the placement and connection of circuit patterns (i.e., layout) that constitute various circuits. As the size of circuit patterns has been reduced, the design of semiconductor ICs may include coloring the layout for a double patterning process or a multi-patterning process. A variety of studies researching the coloring of IC layouts have been conducted.

SUMMARY

Embodiments according to the inventive concept can provide methods, systems, and computer program products providing layout data for integrated circuits. Pursuant to these embodiments, a method can include separating a design area of a substrate for a semiconductor integrated circuit (IC) into cell blocks, a distance between adjacent ones of the cell blocks being greater than or equal to a minimum distance defined by a design rule for the semiconductor integrated circuit to provide separated cell blocks, designing a layout for the semiconductor IC in the separated cell blocks, and individually coloring the layout of each of the separated cell blocks.

In some embodiments according to the inventive concept, individually coloring the layout of each of the separated cell blocks is performed sequentially. In some embodiments according to the inventive concept, an area of each cell block is equal. In some embodiments according to the inventive concept, individually coloring the layout is performed by a layout decomposition tool, wherein the area is proportional to data processing capability of the layout decomposition tool.

In some embodiments according to the inventive concept, designing the layout includes disposing logic cells having a constant length in a first direction on the substrate, wherein a distance between the adjacent ones of the cell blocks in the first direction is less than a length of the logic cell in the first direction. In some embodiments according to the inventive concept, the distance between the adjacent one of the cell blocks in the first direction is different from a distance between the adjacent ones of the cell blocks in a second direction perpendicular to the first direction.

In some embodiments according to the inventive concept, a method can include separating cell blocks in a design area by more than a design rule for a semiconductor integrated circuit (IC), designing a layout in the cell blocks, and coloring the layout for each of the cell blocks separately from one another.

In some embodiments according to the inventive concept, a shape of at least one of the cell blocks is different from shapes of other cell blocks. In some embodiments according to the inventive concept, the method can further include individually checking the colored layouts for each cell block according to a design rule. In some embodiments according to the inventive concept, checking the colored layouts for each cell block is performed sequentially.

In some embodiments according to the inventive concept, a method can include separating a design area of a substrate for a semiconductor integrated circuit (IC) by disposing break cells within the design area to provide a separated design area, designing a layout for the semiconductor IC by disposing logic cells between the break cells according to a circuit schematic, and coloring the layout in the separated design area, wherein a distance between the separated design areas is a minimum distance defined by a design rule or more.

In some embodiments according to the inventive concept, designing the layout further includes disposing endcap cells at an outer side of the design area, wherein a distance between the endcap cell and the logic cell is greater than or equal to the minimum distance.

In some embodiments according to the inventive concept, a computer program product, can include a tangible computer readable storage medium including computer readable program code embodied in the medium that when executed by a processor causes the processor to perform operations including separating a design area of a substrate for a semiconductor integrated circuit (IC) into a plurality of cell blocks, each of the cell blocks being separated from one another by a minimum distance that is at least equal to a design rule for the semiconductor IC, and then generating layout data for a design of the semiconductor IC in each of the plurality of cell blocks.

In some embodiments according to the inventive concept, the computer program product can further include computer readable program code embodied in the medium that when executed by a processor causes the processor to perform operations including coloring the layout data for each of the plurality of cell blocks separately from one another.

In some embodiments according to the inventive concept, generating layout data further includes computer readable program code embodied in the medium that when executed by a processor causes the processor to perform operations including generating the layout data includes placing logic cells having a length in a first direction on the substrate, wherein a distance between directly adjacent ones of the plurality of cell blocks in the first direction is less than the length of the logic cell.

In some embodiments according to the inventive concept, the distance between the directly adjacent one of the plurality of cell blocks in the first direction is different from a distance between directly adjacent ones of the plurality of cell blocks in a second direction on the substrate.

In some embodiments according to the inventive concept, a shape of at least one of the plurality of cell blocks is different from respective shapes of all other ones of the plurality of cell blocks. In some embodiments according to the inventive concept, separating a design area of a substrate further includes computer readable program code embodied in the medium that when executed by a processor causes the processor to perform operations including placing break cells between ones of the plurality of cell blocks in the design area.

In some embodiments according to the inventive concept, a length of each of the break cells in a first direction on the substrate is different from a length of each of the break cells in a second direction on the substrate that is perpendicular to the first direction.

In some embodiments according to the inventive concept, generating layout data further includes computer readable program code embodied in the medium that when executed by a processor causes the processor to perform operations includes placing endcap cells around an outer edge of the design area.

In some embodiments according to the inventive concept, a distance between the endcap cells and the logic cells is greater than or equal to the minimum distance.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 3A, 3B, and 4A to 4C are views showing layouts of semiconductor ICs designed according to some embodiments of the inventive concept;

DETAILED DESCRIPTION OF EMBODIMENTS ACCORDING TO THE INVENTIVE CONCEPT

Figure 1:
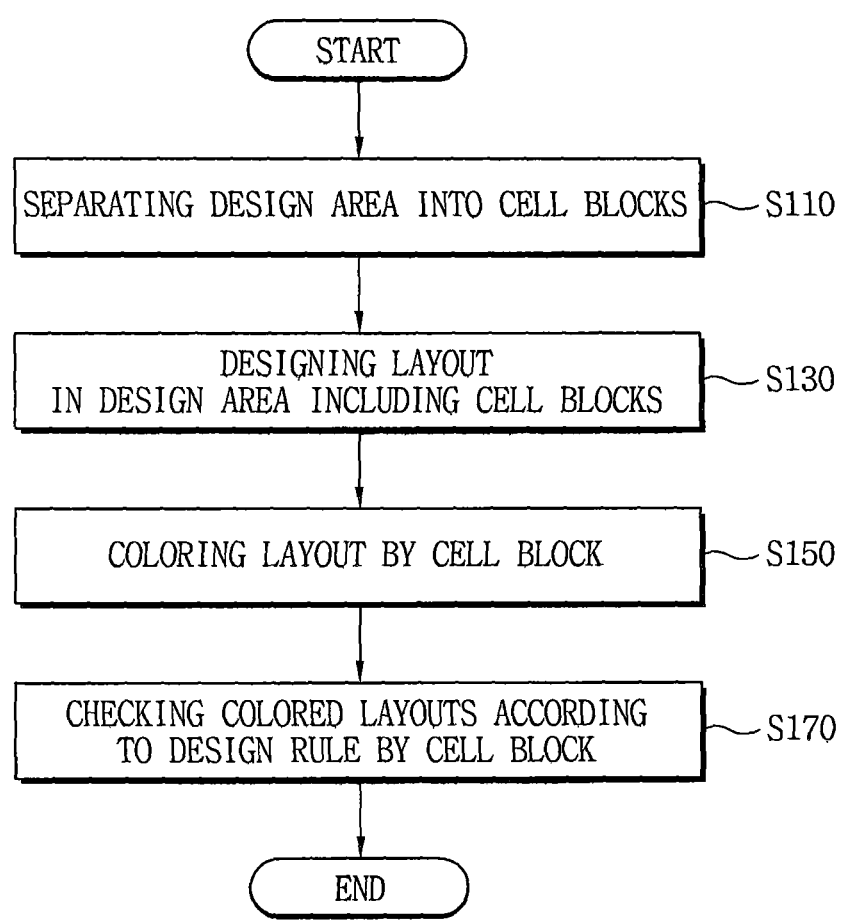
FIG. 1 is a flowchart showing methods of designing semiconductor integrated circuit (IC) in accordance with some embodiments of the inventive concept.

It will be more clearly understood that the objectives, technical configurations, and effects according to the embodiments of the inventive concept are described in detail with reference to the drawings illustrating the embodiments of the inventive concept. Here, in the embodiments of the inventive concept, the scope of the inventive concept is provided in order to be fully conveyed to those skilled in the art. Therefore, it may be embodied in other forms so as not to be limited to the embodiments of the inventive concept described below.

The thicknesses of layers and areas in the drawings may be exaggerated for the sake of clarity. In addition, it will be understood that when a first element is referred to as being "on" a second element, the first element may be located on an upper side being in directly contact with the second element, or other elements may be located between the first element and the second element.

Here, the terms "first," "second," etc. may be used herein to describe various elements, and these elements are only used to distinguish one element from another. However, the first element and the second element could be otherwise designated without departing from the teachings of the inventive concept.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein.

Figure 2A:
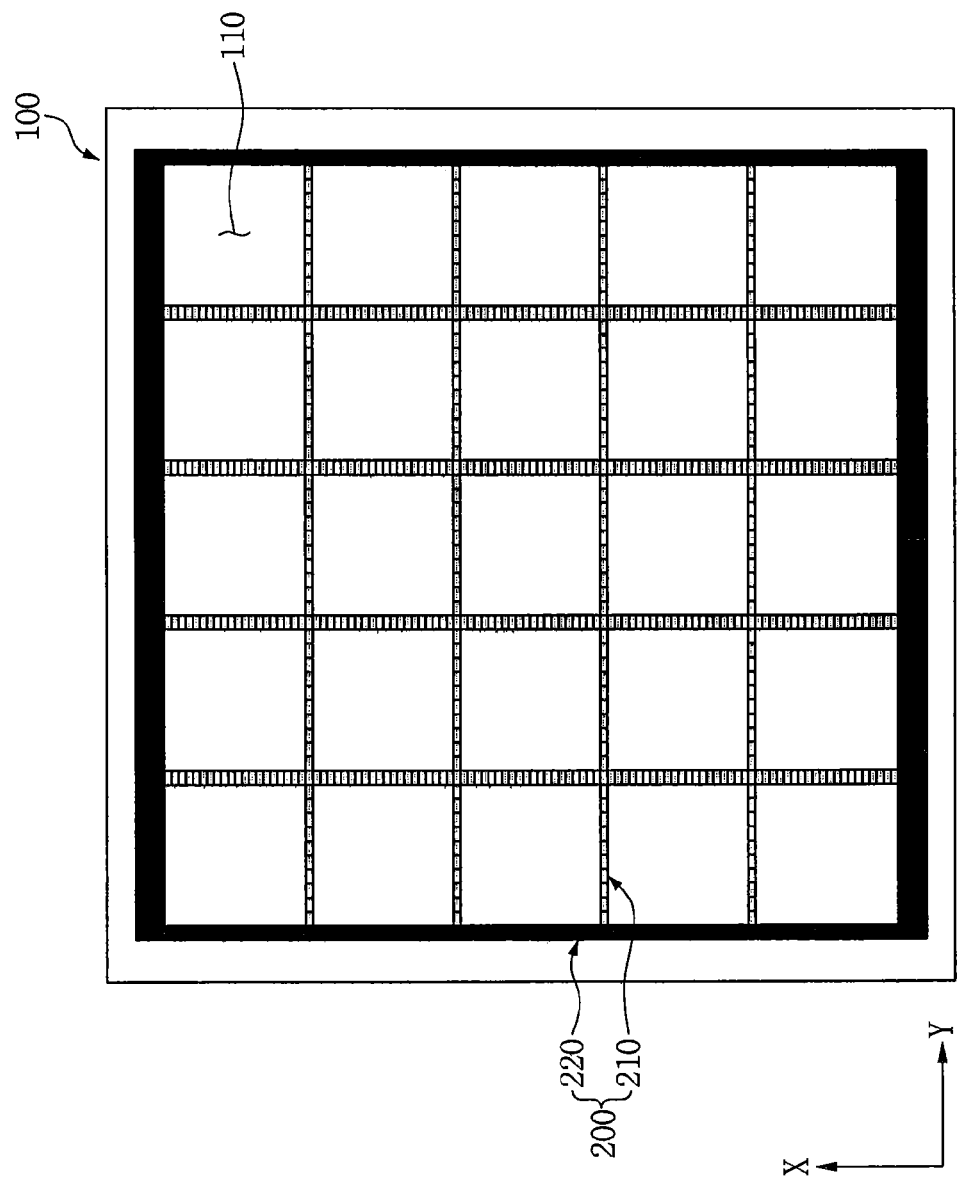
FIGS. 2A and 2B are views showing a sequence for layout of semiconductor ICs designed according to some embodiments of the inventive concept.
Figure 2B:
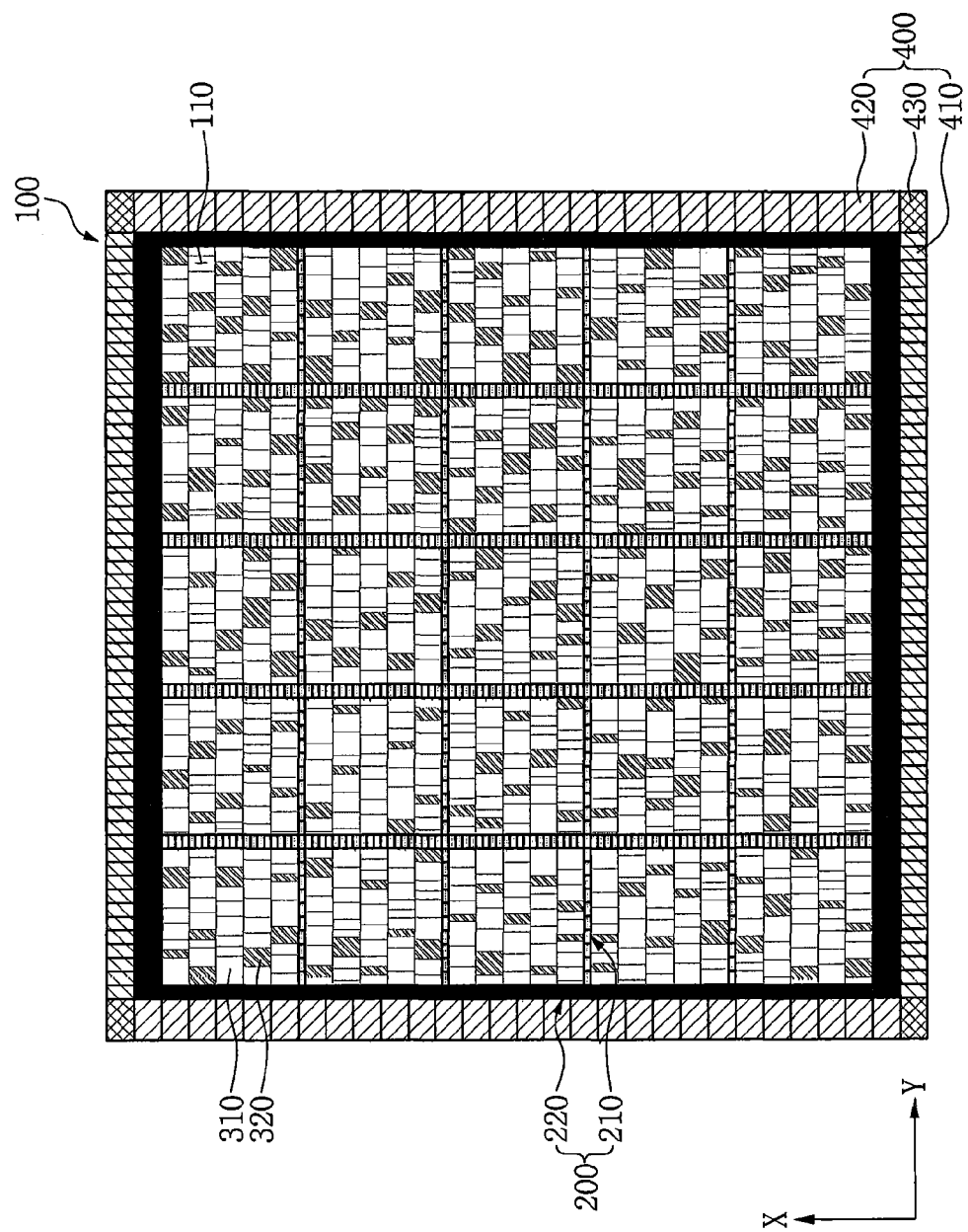

FIG. 1 is a flowchart illustrating methods, systems, and computer program products utilized to provide layout data for the design of semiconductor integrated circuits (ICs) in accordance with some embodiments of the inventive concept. FIGS. 2A and 2B are views showing a layout sequence for semiconductor ICs designed according to some embodiments of the inventive concept. Methods of designing semiconductor ICs in accordance with some embodiments of the inventive concept are described with reference to FIGS. 1, 2A, and 2B.

Referring to FIGS. 1 and 2A, the design of a semiconductor IC in accordance with some embodiments of the inventive concept may include separating a design area 100 into cell blocks 110 (S110).

Each of the cell blocks 110 may be spaced apart from the adjacent cell blocks 110 so as to satisfy a design rule. In some embodiments, distance between the adjacent cell blocks 110 may be greater than or equal to a minimum distance defined by the design rule.

A distance between the adjacent cell blocks 110 in a first direction X may be different from a distance between the adjacent cell blocks 110 in a second direction Y perpendicular to the first direction X. For example, the distance between the adjacent cell blocks 110 in the first direction X may be less than the distance between the adjacent cell blocks 110 in the second direction Y. The distance between the adjacent cell blocks 110 in the first direction X may be equal to the minimum distance defined by the design rule.

Each of the cell blocks 110 may have the same shape. For example, the cell block 110 may have a rectangular shape. The area of each cell block 110 may be constant. For example, the design area 100 may be separated into the cell blocks 110, each having the same shape and area. The cell blocks 110 may be arranged in the design area 100 in a mesh form.

In methods of designing the semiconductor IC in accordance with some embodiments of the inventive concept, the design area 100 may be separated into the cell blocks 110 having the same area. However, in some embodiments of the inventive concept, the design area 100 may be separated into the cell blocks 110 having an area of a specific size or less. For example, methods of designing semiconductor ICs in accordance with some embodiments of the inventive concept includes separating the design area 100 into the cell blocks 110, wherein the cell blocks have different areas from each other, wherein the area of each of the cell blocks 110 may be a set area or less.

Separating the design area 100 into the cell blocks 110 (S110) may include disposing break cells 200 in the design area 100. A distance between the cell blocks 110 separated by the break cells 200 may be a minimum distance defined by a design rule or more. The break cells 200 may not affect layouts to be formed by a subsequent process. For example, the break cells 200 may not include any circuit patterns.

The break cells 200 may surround each of the cell blocks 110 to separate each of the cell blocks from adjacent ones of the cell blocks. Each of the cell blocks 110 may be defined by the break cells 200. The break cells 200 may include inner break cells 210 located between the cell blocks 110 and outer break cells 220 located on the outer side of the cell blocks 110.

The adjacent cell blocks 110 may be spaced apart by the inner break cells 210. For example, the inner break cells 210 may be disposed between the adjacent cell blocks 110 in a single column or row.

A length of the inner break cell 210 in the first direction X may be different from a length of the inner break cell 210 in the second direction Y. For example, the length of the inner break cell 210 in the first direction X may be less than the length of the inner break cell 210 in the second direction Y. In some embodiments, length of the inner break cell 210 in the first direction X may be equal to the minimum distance defined by the design rule.

The outer break cells 22Q may surround the cell blocks 110 and the inner break cells 210. The cell blocks 110 and the inner break cells 210 may be located in areas defined by the outer break cells 220.

A shape of the outer break cell 220 may be different from a shape of the inner break cell 210. For example, a length of the outer break cell 220 in the second direction Y may be less than a length of the outer break cell 220 in the first direction X.

An area of the outer break cell 220 may be different from an area of the inner break cell 210. For example, the area of the outer break cell 220 may be greater than the area of the inner break cell 210. The length of the outer break cell 220 in the first direction X may be greater than the length of the inner break cell 210 in the first direction X. The length of the outer break cell 220 in the second direction Y may be equal to the length of the inner break cell 210 in the second direction Y. For example, the lengths of the outer break cells 220 in the first direction X and second direction Y may be greater than the minimum distance defined by the design rule.

Referring to FIGS. 1 and 2B, methods of designing semiconductor ICs in accordance with some embodiments of the inventive concept may include designing a layout in the design area 100 including the cell blocks 110 (S130).

Designing the layout (S130) may include disposing circuit patterns that constitute various circuits in the separated cell blocks 110. For example, designing the layout (S130) may include disposing logic cells 310 inside cell blocks 110 that are delineated by the break cells 200 in the first and second directions. Designing the layout (S130) may refer to place and route (PnR) operations.

Each of the logic cells 310 may include circuit patterns that constitute a specific circuit. The logic cells 310 may have the same length in the first direction X. A length of each of the logic cells 310 in the second direction Y may be different from the length of the adjacent logic cells 310 in the second direction Y in the same cell block 110. For example, designing the layout (S130) may include disposing a logic column which includes the standard logic cells 310 disposed in the second direction Y, in each of the cell blocks 110 and in the first direction X.

In methods of designing semiconductor ICs in accordance with some embodiments of the inventive concept, the lengths of the logic cells 310 in the first direction X are described as being equal to each other. However, in some embodiments of the inventive concept, the length of each of the logic cells 310 in the first direction X may be different from each other. For example, in methods of designing the semiconductor ICs in accordance with some embodiments of the inventive concept, designing the layout (S130) may include disposing logic rows having different lengths in the first direction X in each cell block 110.

The distance between the adjacent cell blocks 110 in the first direction X may be different from the length of the logic cell 310 in the first direction X. For example, the distance between the adjacent cell blocks 110 in the first direction X may be less than the length of the logic cell 310 in the first direction X. The length of the inner break cell 210 in the first direction X may be less than the length of the logic cell 310 in the first direction X. The length of the outer break cell 220 in the first direction X may be equal to the length of the logic cell 310 in the first direction X.

Designing the layout (S130) may further include disposing at least one filler cell 320 in the separated cell blocks 110. The filler cells 320 may be disposed between the logic cells 310. For example, the filler cells 320 may fill spaces between the logic cells 310 in order to standardize process density. The filler cell 320 may include a pattern that does not affect a circuit constituted by the logic cells 310.

Designing the layout (S130) may include disposing endcap cells 400 outside the break cells 200. The endcap cells 400 may be located on the outer side of the cell blocks 110 in order to standardize process density. The endcap cells 400 may include at least one dummy pattern.

The endcap cells 400 may be spaced apart from the cell blocks 110 so as to satisfy the design rule. The endcap cells 400 may be located on the outer side of the outer break cells 220. For example, the endcap cells 400 may be disposed along edges of the design area 100.

The endcap cells 400 may include first endcap cells 410, second endcap cells 420, and third endcap cells 430. The first endcap cells 410 may be disposed along edges of the design area 100 extending in the second direction Y. The second endcap cells 420 may be disposed along edges of the design area 100 extending in the first direction X. A shape of the second endcap cell 420 may be different from a shape of the first endcap cell 410. The third endcap cells 430 may be disposed in corners of the design area 100. A shape of the third endcap cell 430 may be different from the shape of the first endcap cell 410.

A distance between the endcap cell 400 and the logic cell 310 in the first direction X may be different from a distance between the endcap cell 400 and the logic cell 310 in the second direction Y. For example, the distance between the first endcap cell 410 and the cell block 110 in the first direction X may be greater than the distance between the second endcap cell 420 and the cell block 110 in the second direction Y.

The outer break cells 220 may be disposed in a single row and/or column between the endcap cells 400 and the cell blocks 110 to, for example, surround all of the cell blocks 110. The distance between the first endcap cell 410 and the cell block 110 in the first direction X may be equal to the length of the outer break cell 220 in the first direction X. The distance between the adjacent cell blocks 110 in the first direction X may be less than the distance between the first endcap cell 410 and the cell block 110 in the first direction X. The distance between the second endcap cell 420 and the cell block 110 in the second direction Y may be equal to the length of the outer break cell 220 in the second direction Y. For example, the distance between the adjacent cell blocks 110 in the second direction Y may be equal to the distance between the second endcap cell 420 and the cell block 110 in the second direction Y.

Methods of designing semiconductor ICs in accordance with some embodiments of the inventive concept may include coloring the layout by the cell block 110 (S150).

Coloring the layout (S150) refers to decomposition of the layout so that the corresponding layout is formed using two or more photolithography processes due to a limitation of the photolithography process. As appreciated by the present inventors, the time used for coloring the layout can be proportional to the number of the circuit patterns included in the corresponding layout and the number of the circuit patterns that are spaced apart so as not to satisfy the design rule among the circuit patterns. In methods of designing semiconductor ICs in accordance with some embodiments of the inventive concept, however, since the layout is designed in the separated cell blocks 110 to satisfy the design rule, coloring the layout of each cell block 110 may be individually performed. That is, in methods of designing semiconductor ICs in accordance with some embodiments of the inventive concept, the maximum number of operations may be reduced compared to the coloring the entire layout in one shot. For example, in order to decompose the layout including the 64 circuit patterns spaced apart so as not to satisfy the design rule for forming four photolithography processes, up to $4^{64}$ operations may be used. However, in methods of designing semiconductor ICs in accordance with some embodiments of the inventive concept, since the layout is designed in cell blocks that are separated to satisfy a design rule, the designed layout is individually colored on a cell block basis to generate four circuit patterns, so the coloring of the entire layout may be completed by performing up to $4*4^{16}$ operations.

Accordingly, in methods of designing semiconductor ICs in accordance with some embodiments of the inventive concept, the time used for coloring the entire layout may be reduced. Therefore, in methods of designing semiconductor ICs in some embodiments of the inventive concept, the coloring of the layout can be efficiently performed.

Coloring the layout (S150) may include sequentially performing the coloring of the layout of each cell block 110.

In methods of designing semiconductor ICs in accordance with some embodiments of the inventive concept, coloring the layout designed for each cell block 110 is sequentially performed. However, in methods of designing semiconductor ICs in some embodiments of the inventive concept, coloring the layout of each cell block 110 may be simultaneously performed.

Methods of designing semiconductor ICs in accordance with some embodiments of the inventive concept may include checking the colored layouts according to a design rule by the cell block 110 (S170).

Since the distance between the adjacent cell blocks 110 is greater than or equal to the minimum distance defined by the design rule, the colored layouts of each cell block 110 may be individually checked according to the design rule. The checking of the colored layouts according to the design rule may be sequentially performed by the cell block 110.

In method of designing semiconductor ICs in accordance with some embodiments of the inventive concept, checking the colored layouts of each cell block 110 according to the design rule is sequentially performed. However, in methods of designing semiconductor ICs in accordance with some embodiments of the inventive concept, checking the colored layouts of each cell block 110 according to design rule may be simultaneously performed.

In methods of designing semiconductor ICs in accordance with some embodiments of the inventive concept, the distance between the adjacent cell blocks 110 in the first direction X is described as being less than the length of the logic cell 310 in the first direction X. However, as shown in FIG. 3A, in methods of designing semiconductor ICs in accordance with some embodiments of the inventive concept, the distance between the adjacent cell blocks 110 in the first direction X may be equal to the length of the logic cell 310 in the first direction X. In this case, the length of the inner break cell 210 in the first direction X may be equal to the length of the logic cell 310 in the first direction X.

Figure 3B:
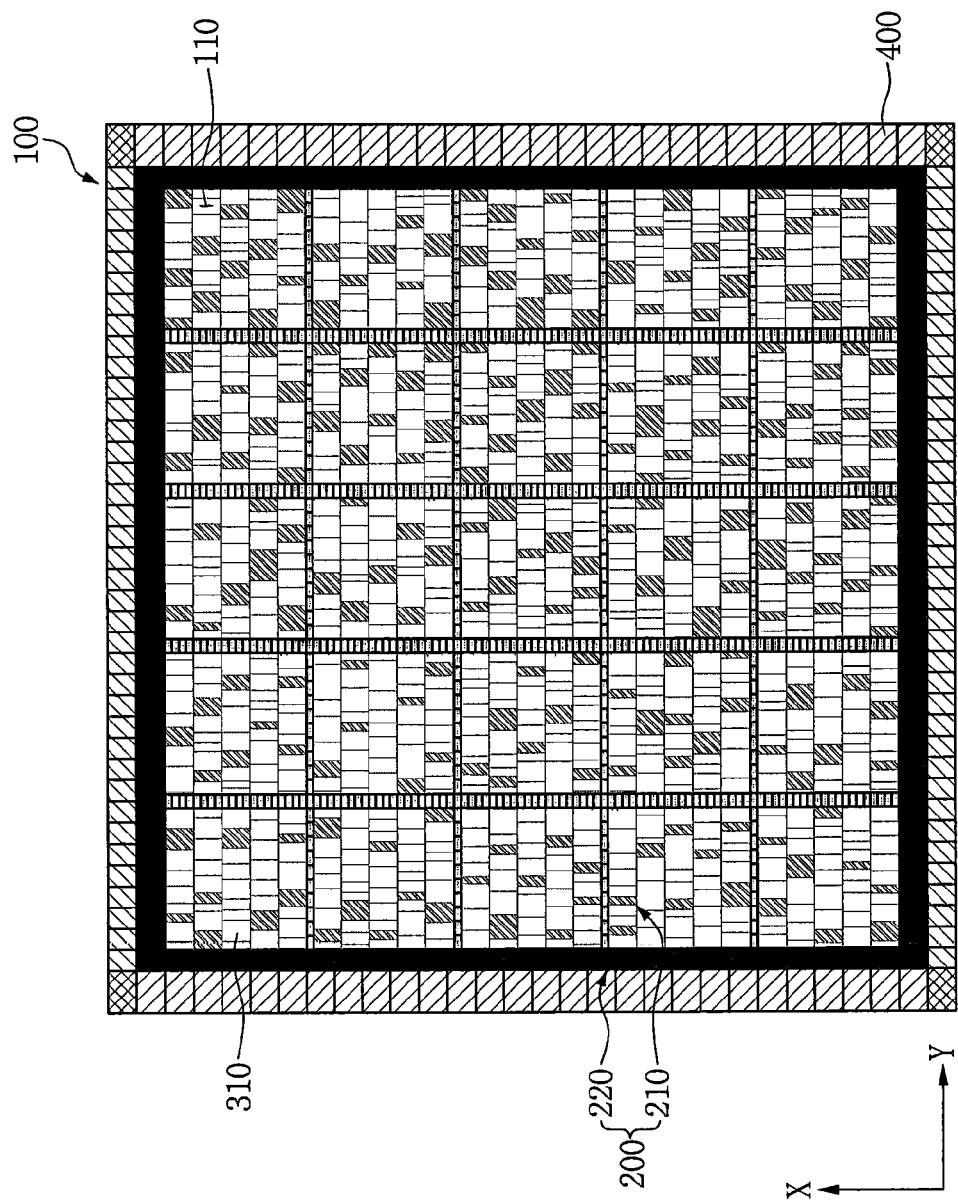

Further, in methods of designing semiconductor ICs in accordance with some embodiments of the inventive concept, the length of the outer break cell 220 in the second direction Y is described as being equal to the length of the inner break cell 210 in the second direction Y. However, as shown in FIG. 3B, in methods of designing semiconductor ICs in accordance with some embodiments of the inventive concept, the length of the outer break cell 220 in the second direction Y may be greater than the length of the inner break cell 210 in the second direction Y. In this case, the distance between the endcap cell 400 and the adjacent cell block 110 in the second direction Y may be greater than the distance between the adjacent cell blocks 110 in the second direction Y.

Figure 4A:
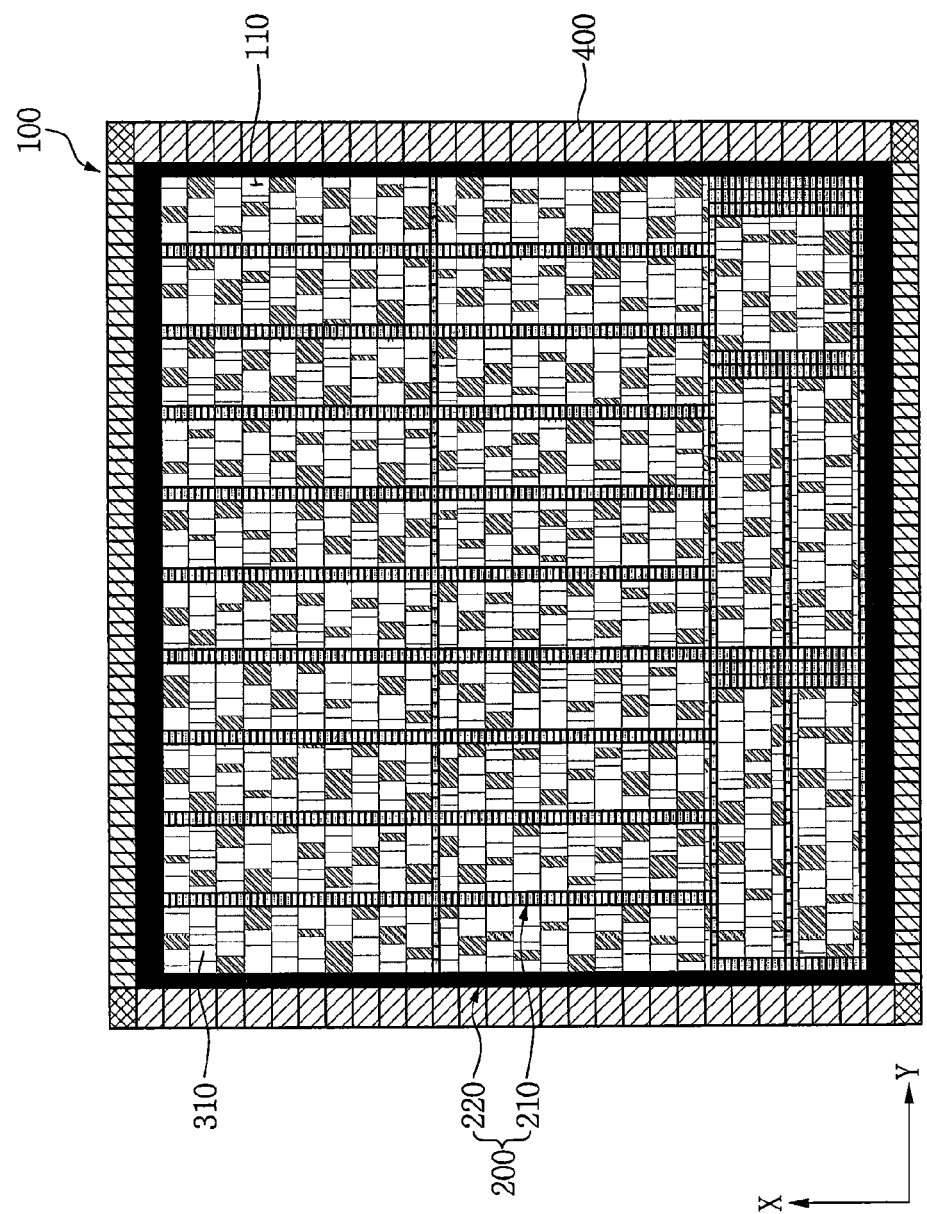
Figure 4B:
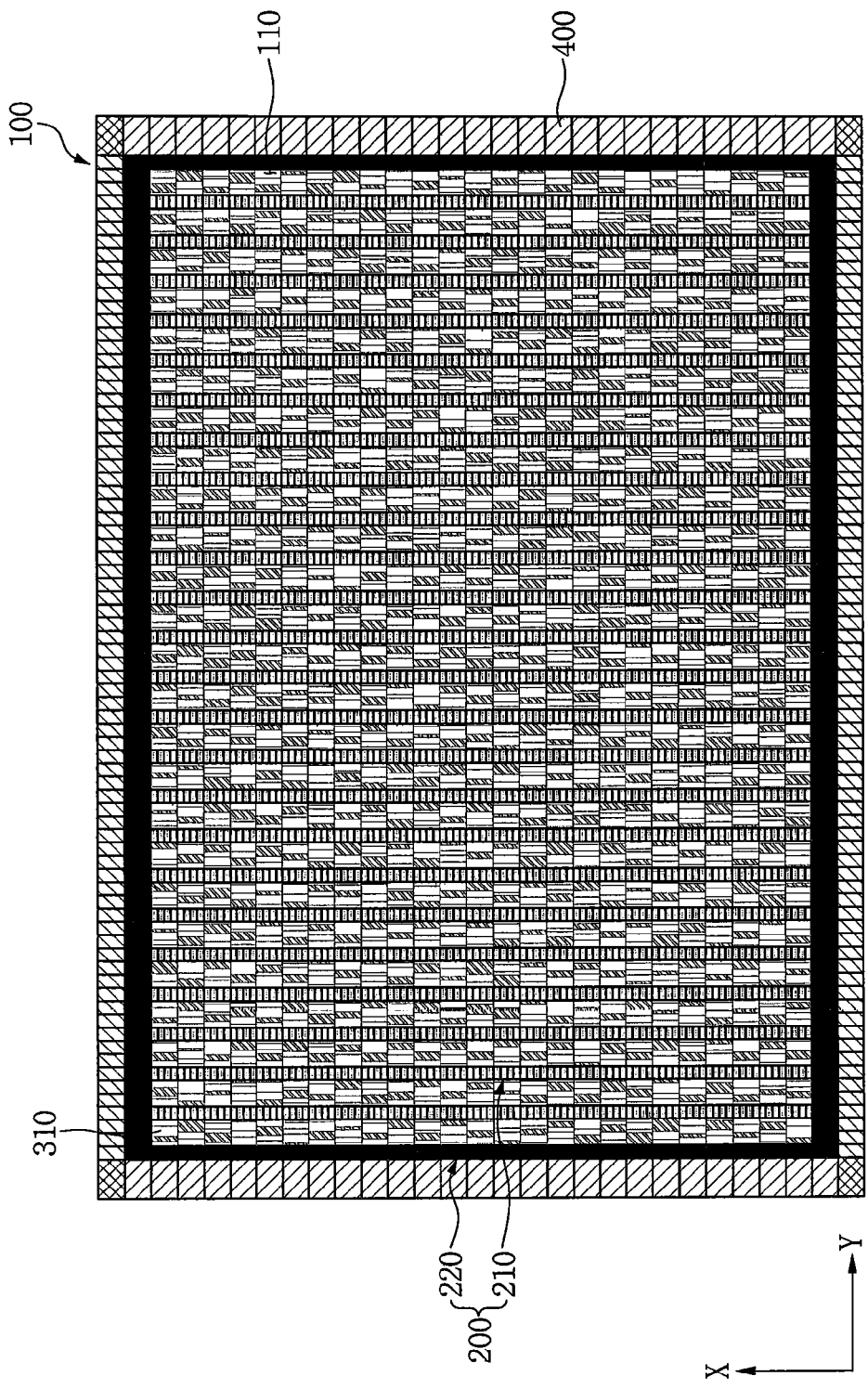
Figure 4C:
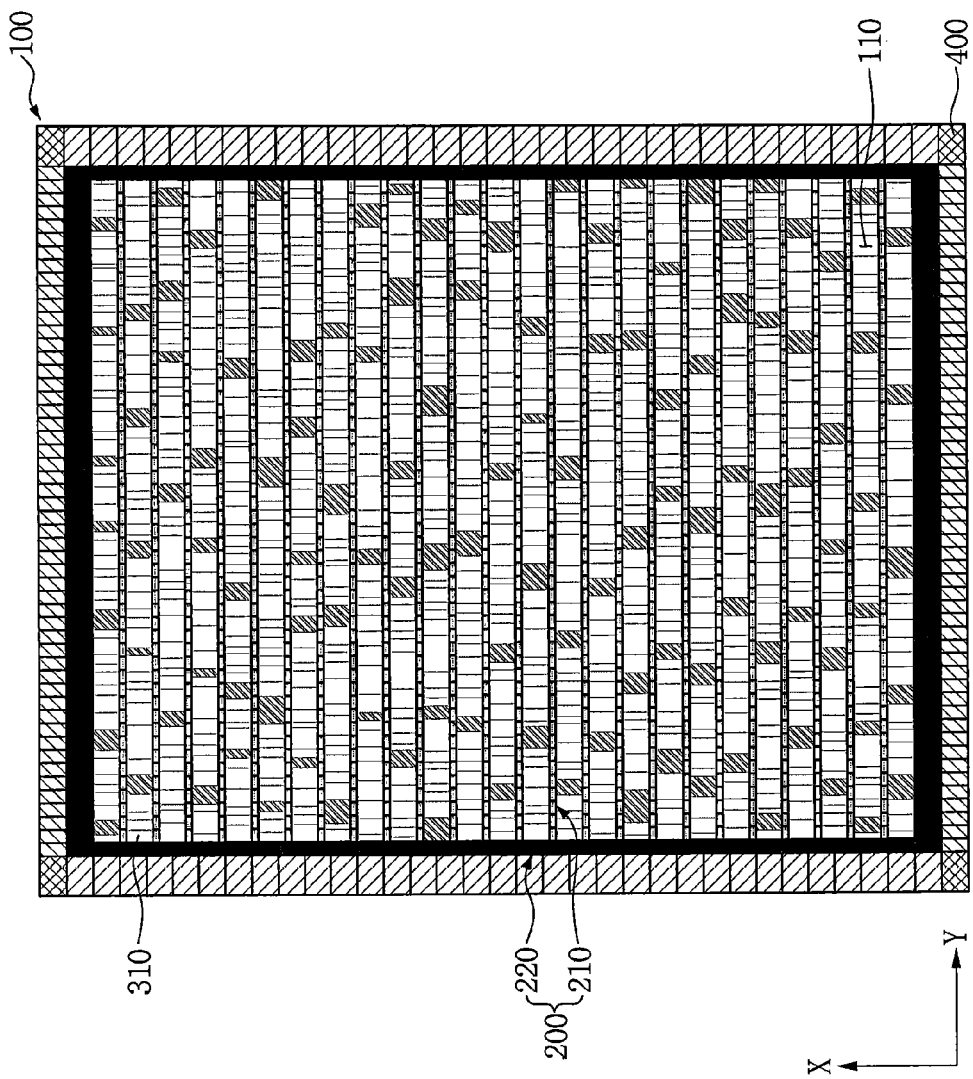

In addition, in methods of designing semiconductor ICs in accordance with some embodiments of the inventive concept, each of the cell blocks 110 has the same shape and area arranged in a mesh form. However, as shown in FIG. 4A, in methods of designing semiconductor ICs in accordance with some embodiments of the inventive concept, the shape of at least one of the cell blocks 110 may be different from the shapes of other cell blocks 110. Further, as shown in FIGS. 4B and 4C, in methods of designing semiconductor ICs in accordance with some embodiments of the inventive concept, each of the cell blocks 110 may have a shape extending in one direction (such as a row or column).

Figure 5:
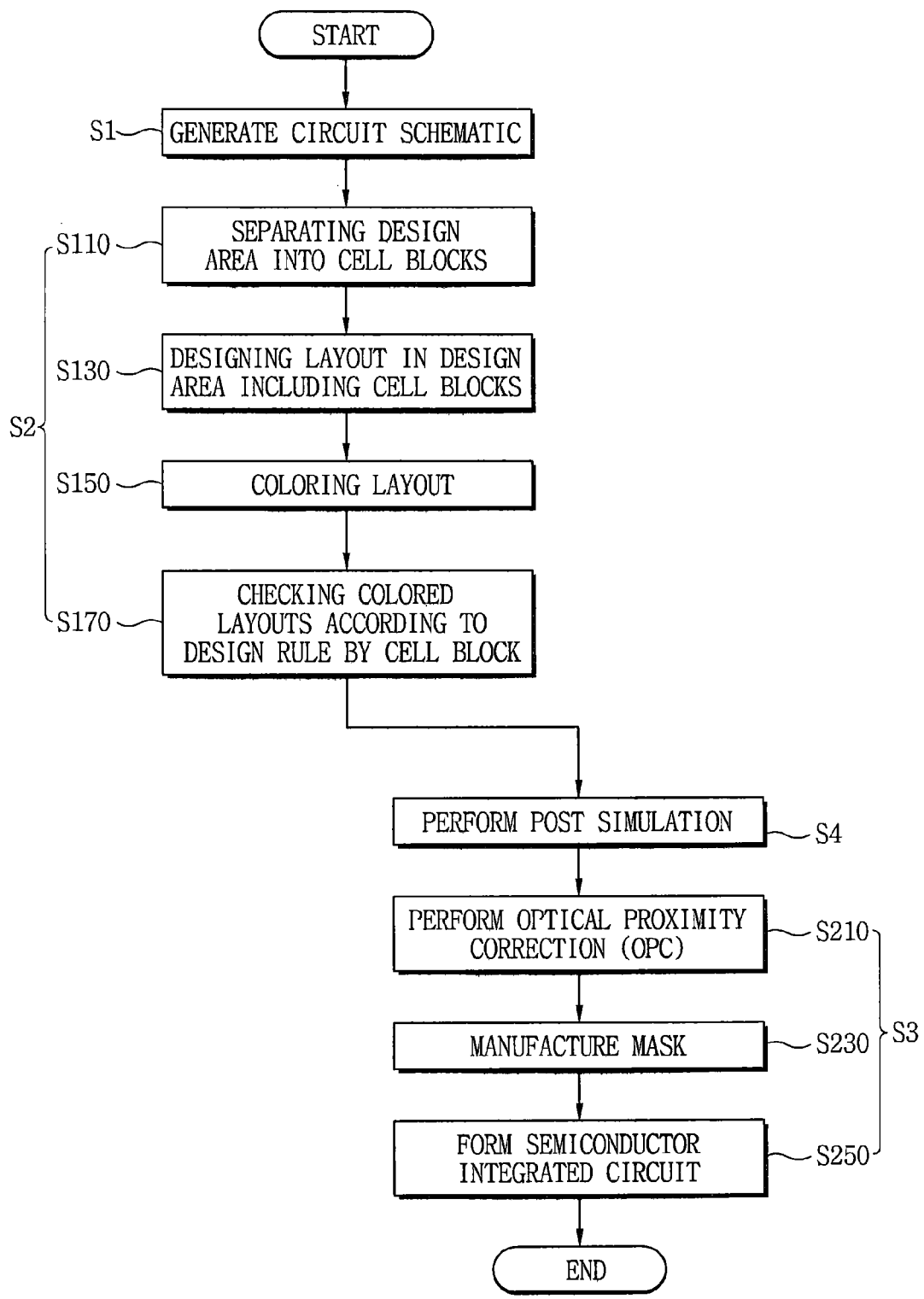
FIG. 5 is a flowchart showing methods of designing semiconductor ICs in accordance with some embodiments of the inventive concept.

FIG. 5 is a flowchart showing methods of designing semiconductor ICs in accordance with some embodiments of the inventive concept.

Referring to FIG. 5, methods of designing semiconductor ICs in accordance with some embodiments of the inventive concept may include generating a circuit schematic (S1), generating a layout (S2) for the circuit, and manufacturing the semiconductor IC that includes the circuit using the layout (S3) that makes the circuit using the layout.

The circuit schematic may indicate connections of various circuit devices that constitute the semiconductor IC. A generation of the circuit schematic may be performed by a circuit design tool such as a computer aided design (CAD) tool.

The generating of the circuit schematic (S1) may include performing a pre-simulation which simulates the operation of the generated circuit.

Generating the layout (S2) may be the same as designing the semiconductor IC shown in FIG. 1. For example, generating the layout (S2) may include separating the design area 100 into the cell blocks 110 (S110), designing the layout for the circuit in the design area 100 including the cell blocks 110 (S130), coloring the layout by the cell block 110 (S150), and checking the colored layouts according to a design rule by the cell block 110 (S170).

The manufacturing of the semiconductor IC (S3) may include performing optical proximity correction (OPC) (S210), manufacturing a mask (S230), and forming the semiconductor IC (S250).

The performing of the OPC (S210) may include correcting the layout in consideration of errors due to an optical proximity effect. The manufacturing of the mask S230) may include manufacturing the mask using the layout corrected by the performing of the OPC. The mask may be manufactured for each colored layouts. Forming of semiconductor IC (S250) may include forming the semiconductor IC on a wafer using the manufactured mask through a photolithography process.

Methods of designing semiconductor ICs in accordance with some embodiments of the inventive concept may further include performing a post-simulation (S4). Performing of the post-simulation (S4) may include performing layout versus schematic (LVS) and performing an electric rule check (ERC) on the completed layout. LVS may refer to determining whether the completed layout corresponds with the circuit schematic. The ERC may refer to determining whether circuits and interconnections are electrically and properly connected or not in the completed layout.

Figure 6A:
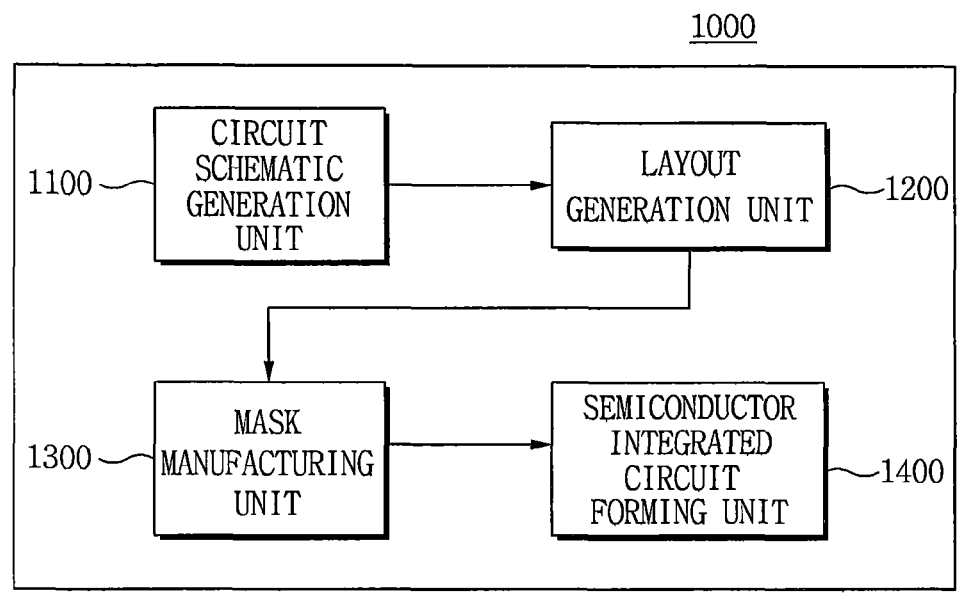
FIG. 6A is a schematic view showing a semiconductor IC manufacturing system in accordance with some embodiments of the inventive concept.
Figure 6B:
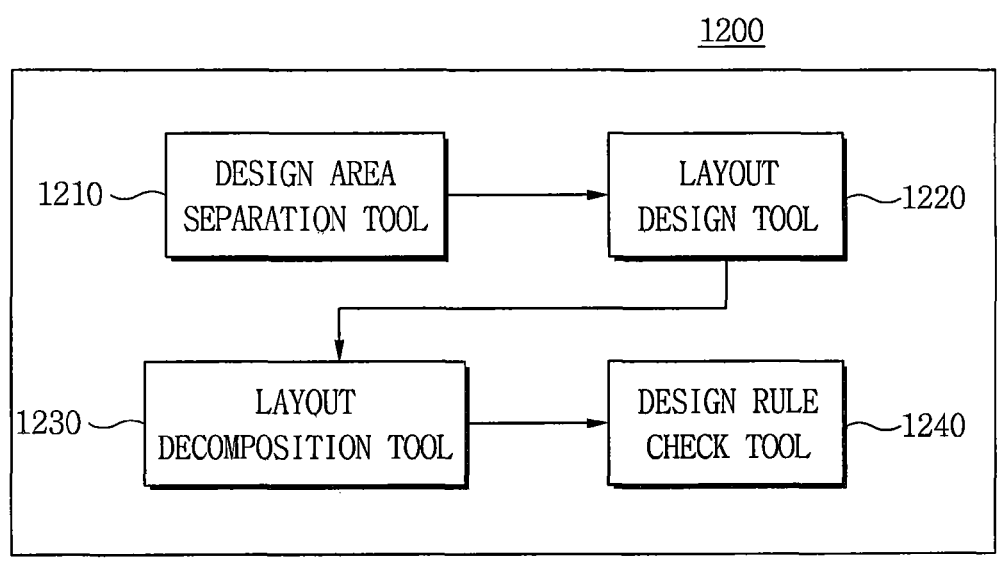
FIG. 6B is a schematic view showing a layout generation unit of the semiconductor IC manufacturing system in accordance with some embodiments of the inventive concept.

FIG. 6A is a schematic view showing a semiconductor IC manufacturing system in accordance with some embodiments of the inventive concept. FIG. 6B is a schematic view showing a layout generation unit of the semiconductor IC manufacturing system in accordance with the embodiment of the inventive concept.

Referring to FIGS. 6A and 6B, the semiconductor IC manufacturing system 1000 in accordance with some embodiments of the inventive concept may include a circuit schematic generation unit 1100, a layout generation unit 1200, a mask manufacturing unit 1300, and a semiconductor IC forming unit 1400. Each of the circuit schematic generation unit 1100, the layout generation unit 1200, the mask manufacturing unit 1300, and the semiconductor IC forming unit 1400 may be a separate device.

The circuit schematic generation unit 1100 may generate a circuit schematic. The circuit schematic generated by the circuit schematic generation unit 1100 may be transferred to the layout generation unit 1200.

The layout generation unit 1200 may include a design area separation tool 1210, a layout design tool 1220, a layout decomposition tool 1230, and a design rule check tool 1240.

The design area separation tool 1210 may separate a design area in which layout according to the circuit schematic will be designed, into cell blocks spaced apart from each other so as to satisfy the design rule. For example, the design area separation tool 1210 may dispose break cells configured to define the cell blocks in the design area. The adjacent cell blocks may be spaced apart from each other by the break cells to be greater than or equal to the minimum distance defined by a design rule.

The design area separation tool 1210 may separate the design area based on a specific size set by the designer. For example, the design area separation tool 1210 may separate the design area into the cell blocks of the set size or less. For example, the cell blocks separated by the design area separation tool 1210 may have the same area.

The layout design tool 1220 may design the layout according to the circuit schematic in the separated design area separated by the design area separation tool 1210. The layout according to the circuit schematic may be designed in the cell blocks of the design area by the layout design tool 1220. For example, the layout design tool 1220 may dispose logic cells between the break cells. For example, the layout design tool 1220 may dispose at least one filler cell between the logic cells. For example, the layout design tool 1220 may dispose endcap cells on the outer side of the break cells.

The layout decomposition tool 1230 may perform coloring the layout designed by the layout design tool 1220. Since the distance between the adjacent cell blocks is greater than or equal to the minimum distance defined by the design rule, coloring the layout of each cell block may be individually performed by the layout decomposition tool 1230. For example, the area of each of the cell blocks may be proportional to the data processing capacity of the layout decomposition tool 1230.

The semiconductor IC manufacturing system 1000 in accordance with some embodiments of the inventive concept may perform coloring of the layout by the cell block. That is, in the semiconductor IC manufacturing system 1000 in accordance with some embodiments of the inventive concept, the coloring of the layout may be performed by the layout separation tool 1230 on the cell blocks sequentially. Thus, in the semiconductor IC manufacturing system 1000 in accordance with some embodiments of the inventive concept, the amount of data transferred to the layout decomposition tool 1230 may be reduced. Therefore, in the semiconductor IC manufacturing system 1000 in accordance with some embodiments of the inventive concept, memory usage of the layout decomposition tool 1230 for the coloring of the layouts may be reduced.

In the semiconductor IC manufacturing system 1000 in accordance with some embodiments of the inventive concept, the coloring of the designed layout may be sequentially performed by the cell block. However, in the semiconductor IC manufacturing system 1000 in accordance with some embodiments of the inventive concept, the coloring of the layout of each cell block may be simultaneously performed. For example, in the semiconductor IC manufacturing system 1000 in accordance with some embodiments of the inventive concept, the layout decomposition tool 1230 may perform the coloring of the layout in parallel.

The design rule check tool 1240 may check the layouts colored by the layout decomposition tool 1230 according to a design rule. The colored layouts of each cell block may be checked according to the design rule by the cell block by the design rule check tool 1240. The design rule check tool 1240 may sequentially the check the colored layouts according to the design rule by the cell block.

In the semiconductor IC manufacturing system 1000 in accordance with the embodiment of the inventive concept, checking the colored layouts according to the design rule may be sequentially performed by the cell block. However, the semiconductor IC manufacturing system 1000 in accordance with some embodiments of the inventive concept, checking of the colored layouts according to the design rule may be simultaneously performed. For example, in the semiconductor IC manufacturing system 1000 in accordance with some embodiments of the inventive concept, the design rule check tool 1240 may perform the checking of the colored layouts of each cell block according to the design rule in parallel.

The layouts generated by the layout generation unit 1200 may be transferred to the mask manufacturing unit 1300.

The mask manufacturing unit 1300 may manufacture a mask using the generated layout. The mask manufacturing unit 1300 may perform OPC on the generated layout. The mask manufacturing unit 1300 may manufacture the mask for each color of the generated layout. The mask manufactured by the mask manufacturing unit 1300 may be transferred to the semiconductor IC forming unit 1400.

The semiconductor IC forming unit 1400 may form the semiconductor IC using the manufactured mask through a photolithography process.

Figure 7:
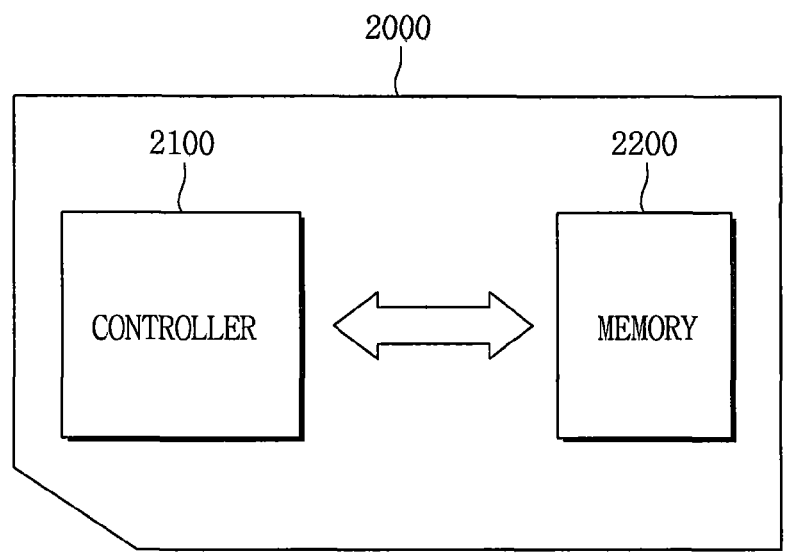
FIG. 7 is a schematic view showing a semiconductor module including the semiconductor IC formed according to some embodiments of the inventive concept.

FIG. 7 is a schematic view showing a semiconductor module including the semiconductor IC formed according to some embodiments of the inventive concept.

The semiconductor module 2000 may include a controller 2100 and a memory 2200. For example, the semiconductor module 2000 may be a memory card such as a memory stick card, a smart media (SM) card, a secure digital (SD) card, a mini-SD digital (SD) card, and a multimedia card (MMC).

The controller 2100 may be electrically connected to the memory 2200. The memory 2200 may exchange electrical signals with the controller 2100. For example, the memory 2200 may transmit data according to the signals of the controller 2100.

The controller 210Q and the memory 2200 may include the semiconductor IC formed according to some embodiments of the inventive concept. Thus, production efficiency of the semiconductor module 2000 according to some embodiments of the inventive concept can be improved.

Figure 8:
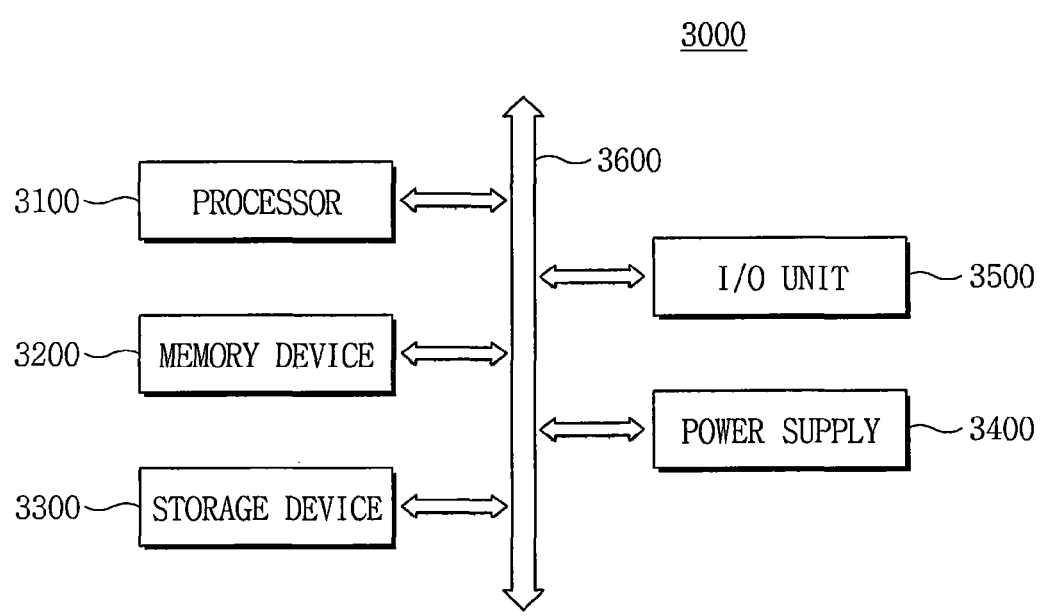
FIG. 8 is a view showing an electronic system including the semiconductor IC formed according to some embodiments of the inventive concept.

FIG. 8 is a view showing an electronic system 3000 including the semiconductor IC formed according to some embodiments of the inventive concept.

The electronic system 3000 may include a processor 3100, a memory device 3200, a storage device 3300, a power supply 3400, and an input/output (I/O) unit 3500. The electronic system 3000 may further include ports in communication with electronic devices such as a video card, a sound card, a memory card, and a USB device.

The processor 3100 may be a micro-processor or a central processing unit (CPU). The processor 3100 may communicate with the memory device 3200, the storage device 3300, and the I/O unit 3500 through a bus 3600 such as an address bus, a control bus, a data bus, or the like. The processor 3100 may be connected to an expansion bus such as a peripheral component interconnect (PCI) bus.

The memory device 3200 may store data required for the corresponding operation of the electronic system 3000. For example, the memory device 3200 may include at least one of a dynamic random-access memory (DRAM), a mobile DRAM, a static RAM, a parallel RAM, a ferroelectric RAM, a resistive RAM, and a magnetoresistive RAM.

The storage device 3300 may include an external storage device such as a solid state drive, a hard disk drive, and a CD-ROM. The power supply 3400 may supply an operating voltage required for the operation of the electronic system 3000. The I/O unit 3500 may include an input unit such as a keyboard, a keypad, a mouse, etc. The I/O unit 3500 may include an output unit such as a printer, a display, etc.

The processor 3100, the memory device 3200, the storage device 3300, the power supply 3400, and the I/O unit 3500 may include the semiconductor IC formed according to some embodiments of the inventive concept. Therefore, production efficiency of the electronic system 3000 according to some embodiments of the inventive concept can be improved In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions According to methods of designing semiconductor ICs in accordance with some embodiments of the inventive concept, coloring of layouts for a double patterning process or a multi-patterning process can be effectively performed. Therefore, in methods of designing semiconductor ICs in accordance with some embodiments of the inventive concept, overall production efficiency can be improved.

What is claimed is:

1. A method comprising:
separating a design area for a semiconductor integrated circuit (IC) into cell blocks prior to disposing a plurality of logic cells within the cell blocks to provide separated cell blocks, wherein separating comprises disposing break cells in the design area;
designing a layout for the semiconductor IC in the separated cell blocks by disposing the plurality of logic cells within the separated cell blocks; and
individually coloring, using a computer, the layout of each of the separated cell blocks.

2. The method of claim 1, wherein individually coloring the layout of each of the separated cell blocks is performed sequentially.

3. The method of claim 1, wherein individually coloring the layout is performed by a layout decomposition tool, and wherein the area is proportional to data processing capability of the layout decomposition tool.

4. The method of claim 1, the logic cells disposed within the separated cell blocks to have a constant length in a first direction on the design area, and
wherein a distance between adjacent ones of the separated cell blocks in the first direction is less than a length of the logic cells in the first direction.

5. The method of claim 4, wherein the distance between the adjacent ones of the separated cell blocks in the first direction is different from a distance between adjacent ones of the separated cell blocks in a second direction perpendicular to the first direction.

6. The method of claim 1, wherein a distance between adjacent ones of the cell blocks is greater than or equal to a minimum distance defined by a design rule for the semiconductor IC.

7. The method of claim 1, wherein the design area is free of logic cells prior to disposing the plurality of logic cells.

8. The method of claim 1, further comprising:
manufacturing a mask using the layout of each of the separated cell blocks; and forming a pattern on a substrate using the mask through a photolithography process.

9. A method comprising:
separating cell blocks in a design area prior to disposing a plurality of logic cells within the cell blocks, wherein separating comprises placing break cells in the design area to define an interface between each directly adjacent cell block extending in at least one direction across the design area;
designing a layout in the cell blocks by disposing the plurality of logic cells within respective ones of the cell blocks; and
coloring the layout, using a computer, for each of the cell blocks separately from one another.

10. The method of claim 9, further comprising individually checking the colored layouts for each cell block according to a design rule for a semiconductor integrated circuit.

11. The method of claim 9, wherein the at least one direction comprises a first direction, wherein a length of each of the break cells in a first direction is different from a length of each of the break cells in a second direction perpendicular to the first direction.

12. The method of claim 9, wherein the break cells include inner break cells disposed between the cell blocks and outer break cells disposed between an edge of the design area and the cell blocks, and wherein a shape of the outer break cells is different from a shape of the inner break cells.

13. The method of claim 9, wherein a first logic cell of a first cell block is adjacent to a second logic cell of a second cell block in a first direction, wherein a distance between the first and second logic cells in the first direction is less than a length of the first logic cell in the first direction.

14. The method of claim 9, wherein the design area is free of logic cells prior to disposing the plurality of logic cells.

15. A method comprising:

separating a design area for a semiconductor integrated circuit (IC) by disposing break cells within the design area to provide separated cell blocks prior to disposing a plurality of logic cells in the cell blocks;

designing a layout for the semiconductor IC by disposing the plurality of logic cells between the break cells according to a circuit schematic; and coloring the layout, using a computer, in respective ones of the separated cell blocks.

16. The method of claim 15, wherein designing the layout further includes disposing endcap cells at an outer side of the design area, and wherein a distance between the endcap cells and the logic cells is greater than or equal to a minimum distance defined by a design rule.

17. The method of claim 16, wherein a distance between the endcap cells and the logic cells in a first direction is different from a distance between the endcap cells and the logic cells in a second direction perpendicular to the first direction.

18. The method of claim 17, wherein the distance between the endcap cells and the logic cells in the first direction is different from a distance between the separated cell blocks in the first direction.

19. The method of claim 18, wherein the distance between the endcap cell and the logic cell in the second direction perpendicular to the first direction is equal to a distance between the separated cell blocks in the second direction.

20. The method of claim 15, wherein the design area is free of logic cells prior to disposing the plurality of logic cells.

* * * * *